(12) United States Patent
Hemmerling et al.

(10) Patent No.: US 7,303,929 B2
(45) Date of Patent: Dec. 4, 2007

(54) RELOADING OF DIE CARRIERS WITHOUT REMOVAL OF DIE CARRIERS FROM SOCKETS ON TEST BOARDS

(75) Inventors: Martin A. Hemmerling, Menlo Park, CA (US); Seang P. Malathong, Redwood City, CA (US)

(73) Assignee: Aehr Test Systems, Fremont, CA (US)

( * ) Notice: Subject to any disclaimer, the term of this patent is extended or adjusted under 35 U.S.C. 154(b) by 189 days.

(21) Appl. No.: 10/940,288

(22) Filed: Sep. 13, 2004

(65) Prior Publication Data

US 2006/0057747 A1 Mar. 16, 2006

(51) Int. Cl.
G01R 31/26 (2006.01)
H01L 21/66 (2006.01)

(52) U.S. Cl. .......... 438/17; 257/E21.522; 257/E21.533

(58) Field of Classification Search .................. 438/17
See application file for complete search history.

(56) References Cited

U.S. PATENT DOCUMENTS

| | | | | |
|---|---|---|---|---|
| 4,433,886 A | * | 2/1984 | Cassarly et al. | 439/65 |
| 5,073,117 A | * | 12/1991 | Malhi et al. | 439/71 |
| 5,407,361 A | * | 4/1995 | Ikeya | 439/72 |
| 5,519,332 A | * | 5/1996 | Wood et al. | 324/755 |
| 5,532,612 A | * | 7/1996 | Liang | 324/760 |
| 5,949,242 A | * | 9/1999 | Wood et al. | 324/760 |
| 5,985,682 A | * | 11/1999 | Higgins, III | 438/10 |
| 6,025,732 A | * | 2/2000 | Foo et al. | 324/760 |
| 6,040,702 A | * | 3/2000 | Hembree et al. | 324/755 |
| 6,072,326 A | * | 6/2000 | Akram et al. | 324/765 |
| 6,512,388 B1 | * | 1/2003 | Satoh et al. | 324/755 |
| 6,583,635 B2 | * | 6/2003 | Hembree et al. | 324/755 |
| 6,856,155 B2 | * | 2/2005 | Tay et al. | 324/755 |
| 6,910,898 B2 | * | 6/2005 | Suzuki et al. | 439/73 |
| 7,002,362 B2 | * | 2/2006 | Farnworth et al. | 324/754 |
| 7,105,366 B2 | * | 9/2006 | Cobbley et al. | 438/15 |
| 7,126,363 B2 | * | 10/2006 | Malathong et al. | 324/755 |

* cited by examiner

*Primary Examiner*—David A. Zarneke
(74) *Attorney, Agent, or Firm*—Blakely, Sokoloff, Taylor & Zafman; Stephen M. De Klerk

(57) ABSTRACT

A method of testing microelectronic dies is described. A respective set of dies is inserted into die carrier bodies releasably held within a set of sockets secured to a burn-in board. A set of die carrier covers is closed, each die carrier cover being secured to a respective die carrier body and closing over a respective die. The burn-in board is then inserted into a burn-in oven. Burn-in testing of the dies is then carried out while in the burn-in oven. The burn-in board is then removed from the oven. The die carrier covers are then opened. The dies are removed from the die carrier bodies without removing the die carrier bodies from the sockets. The process is then repeated with subsequent sets of dies.

7 Claims, 8 Drawing Sheets

TEST

RELOADING OF DIE CARRIERS WITHOUT REMOVAL OF DIE CARRIERS FROM SOCKETS ON TEST BOARDS

BACKGROUND OF THE INVENTION

1). Field of the Invention

This invention relates to a method of testing microelectronic dies.

2). Discussion of Related Art

Integrated circuits are usually manufactured in and on semiconductor wafers. Such a semiconductor wafer is subsequently cut into individual dies, each die carrying a respective integrated circuit. Cutting of a wafer into individual dies is commonly referred to as "dicing" or "singulation."

Once the individual dies are cut from the wafer, it is often advantageous to test the integrated circuit in each die before the packaging of the die. The added expense of packaging of the die can be avoided by first identifying defects in the die. Identification of defects is particularly important for multiple-die assemblies, where one defective die can compromise the value of the entire assembly.

One way of testing a singulated unpackaged die is to temporarily insert the die into a retaining formation in a die carrier body of a die carrier. A plurality of die contacts in the retaining formation make contact with respective ones of a plurality of terminals on the die. External die carrier contacts are electrically connected to the die contacts, and provide surfaces to which electric contact can be made for purposes of providing signals between the die carrier contacts and the terminals on the die.

The die carrier is then inserted into a socket. The socket has a plurality of electrically conductive pins which connects to a burn-in board. The socket also has a plurality of socket contacts that are electrically connected to the pins and make contact with the die carrier contacts. Electric current can thus conduct through the burn-in board connectors and the socket contacts to the die carrier contacts. An electric path is thereby established between the burn-in board and the unpackaged die, and can be used for testing the integrated circuit in the die.

A few types of sockets exist that are used for testing thin small-outline package (TSOP) electronic assemblies. A TSOP is a package having a microelectronic die that is inserted within a mold and having a plurality of 145 micron thin electric leads extending from opposing sides thereof. No die carrier has been designed for use within a TSOP-type socket.

The sockets are typically located in rows and columns on a burn-in board. Tooling is required to remove all the die carriers from the sockets, open the die carriers, replace dies that have been tested with untested dies, close the die carriers, and replace the die carriers in the sockets. The extra tooling increases cost and makes the overall die replacement process more complex.

SUMMARY OF THE INVENTION

According to one aspect of the invention, a microelectronic die connection assembly is provided. The connection assembly includes a socket and a die carrier. The socket includes a socket body, a plurality of electrically conductive circuit board connectors, left and right-spaced rows of electrically conductive lower socket contacts, and left and right-spaced rows of electrically conductive upper socket contacts. The circuit board connectors are located externally on the socket body. The lower and upper socket contacts are also on the socket body, and at least some of the lower socket contacts and at least some of the upper socket contacts are electrically connected to at least some of the circuit board connectors. The upper socket contacts are actuable to move between retracted and contacting positions relative to the left and right rows of lower socket contacts, respectively. The die carrier includes a die carrier body, a plurality of die contacts, and left and right rows of die carrier contacts. The die carrier body has a retaining formation to temporarily and removably receive a microelectronic die. The die contacts are located in the retaining formation to make contact with respective ones of a plurality of terminals on the die. The die carrier contacts are located on and extend from opposing sides of the die carrier body. The die carrier contacts are electrically connected to the die contacts. The rows of die carrier contacts are at a select spacing relative to one another, so as to be insertable between the left and right rows of upper socket contacts when the upper socket contacts are in their retracted position, and so that each die carrier contact is located between a respective pair of upper and lower socket contacts when the upper socket contacts are in their contacting positions.

According to a further aspect of the invention, a die carrier is provided, comprising a die carrier support component, a die carrier substrate, a plurality of die contacts, and a plurality of die carrier contacts. The die carrier support component has a first width. The die carrier substrate is located on the die carrier support component, the die carrier substrate having a second width so that left and right portions of the die carrier substrate extend beyond the die carrier base support component. The die carrier body is located on the die carrier substrate, the die carrier body having a formation to temporarily and removably receive a microelectronic die. The die contacts are located within the retaining formation on the die carrier substrate, to make contact with respective ones of a plurality of terminals on the die. The die carrier contacts are located on at least one surface of each of the left and right portions of the die carrier substrate, the die carrier contacts being electrically connected to the die contacts.

According to a further aspect of the invention, a die carrier is provided, comprising a die carrier base, a die carrier substrate, a die carrier hinge base, a die carrier body, a die carrier hinge component, and a die carrier hinge pin. The die carrier substrate is located on the die carrier base component. The die carrier hinge base is located on the die carrier base. The die carrier body is located on the substrate, and has a formation to temporarily and removably receive a microelectronic die. The die carrier hinge pin is inserted through openings in the die carrier hinge base and the die carrier body to secure the die carrier body to the die carrier hinge base, and through an opening in the die carrier hinge component to secure the die carrier hinge component pivotably to the die carrier hinge base.

According to a further aspect of the invention, a die carrier is provided, comprising a die carrier substrate, a die carrier body, a plurality of die contacts, and a plurality of lower die carrier contacts. The die carrier body is located on the substrate, and has a retaining formation to temporarily and removably receive a microelectronic die. The die contacts are located in the retaining formation on an upper side of the substrate to make contact with respective ones of a plurality of terminals on the die. The lower die carrier contacts are located on lower sides of left and right portions of the substrate, extending beyond the die carrier body, and are electrically connected to at least some of the die contacts.

The invention also provides a method for testing microelectronic dies, including inserting a first set of dies into a set of die carriers releasably held within a set of sockets secured to a test or burn-in board, testing the first set of dies while being held in the die carriers, removing the first set of dies from the die carriers without removing the die carriers from the sockets, inserting a second set of dies into the die carriers releasably held within the socket secured to the test board, testing the second set of dies while being held in the die carriers, and removing the second set of dies from the die carriers without removing the die carriers from the sockets.

The dies may, for example, be bare dies or bare dies with die-specific packages sometimes referred to as Chip Scale Packages or Wafer Level Chip Scale Packages.

Each die may be inserted into a die carrier body of the respective die carrier, and the method may further include closing a respective die carrier cover over each respective die after inserting the respective die into the respective die carrier body, and opening the die carrier covers after testing the respective dies, the die carrier covers opening sufficiently to allow for removal of the dies from the die carriers.

The method may further include inserting the burn-in board with the first set of dies into a burn-in oven to test the dies, and removing the burn-in board with the dies from the burn-in oven after the dies are tested.

The invention also provides a method of testing microelectronic dies, including repeatedly: (i) inserting a respective set of dies into a set of die carrier bodies, releasably held within a set of sockets secured to a burn-in board; (ii) closing a set of die carrier covers, each die carrier cover being secured to a respective die carrier body and closing over a respective die; (iii) inserting the burn-in board into a burn-in oven; (iv) burn-in testing the dies while in the burn-in oven; (v) removing the burn-in board from the burn-in oven; (vi) opening the die carrier covers; and (vii) removing the dies from the die carrier bodies without removing the die carrier bodies from the sockets.

BRIEF DESCRIPTION OF THE DRAWINGS

The invention is further described by way of example with reference to the accompanying drawings, wherein:

FIG. 1A is a cross-sectional side view illustrating the positioning of a compliant rubber membrane in the die carrier of FIG. 1;

DETAILED DESCRIPTION OF THE INVENTION

Figure 1:
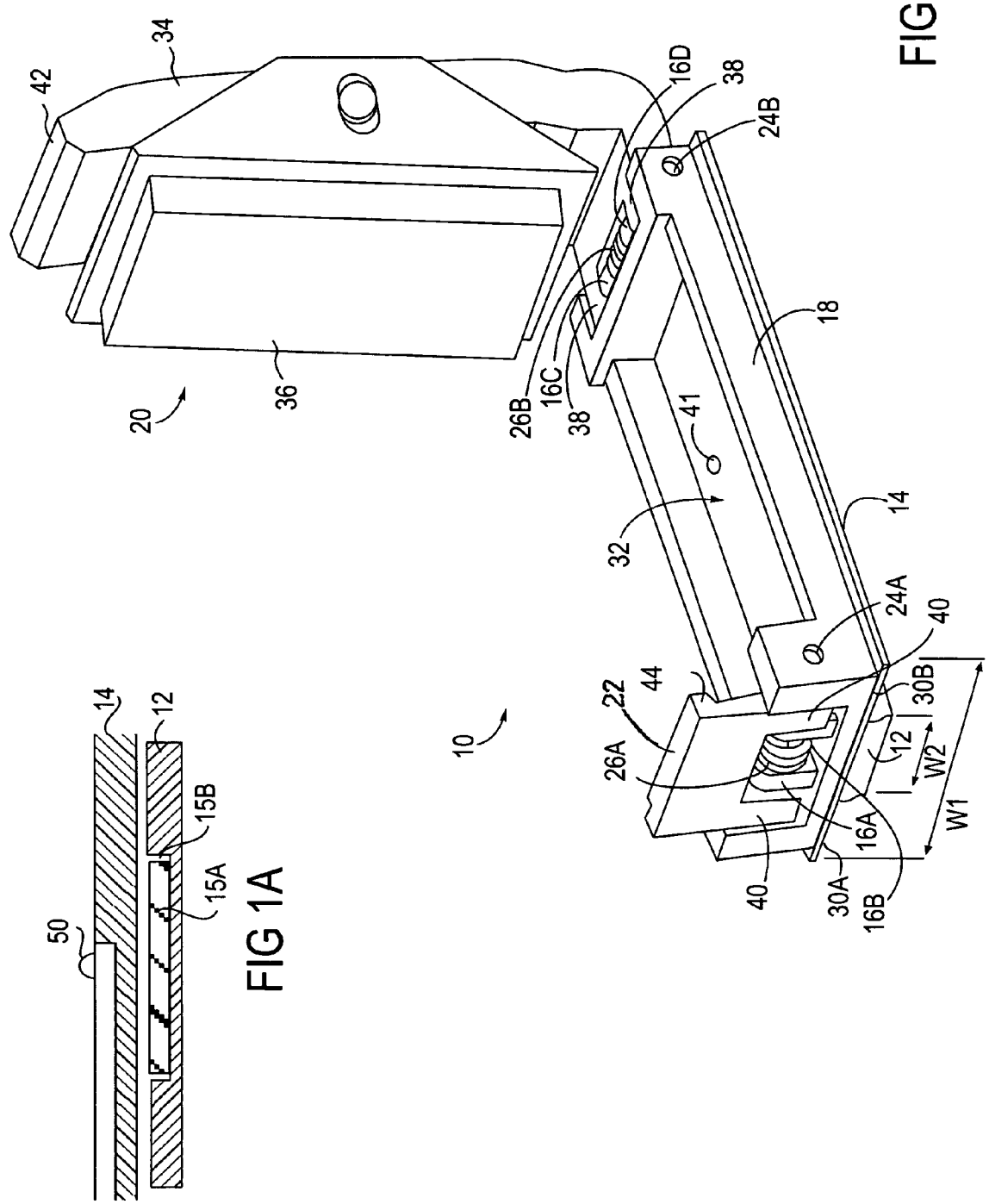
FIG. 1 is a perspective view of a die carrier according to an embodiment of the invention.

FIG. 1 of the accompanying drawings illustrates a die carrier 10 according to an embodiment of the invention, which includes a die carrier base support component 12, a die carrier substrate 14, four die carrier hinge bases 16A-D, a die carrier body 18, a die carrier cover 20, a die carrier latch 22, front and rear die carrier hinge pins 24A and 24B, and front and rear die carrier springs 26A and 26B.

The die carrier hinge bases 16A-D are molded together with, and therefore secured to, the die carrier base support component 12. The die carrier hinge bases 16A and 16B are spaced from one another and extend upward from a front portion of the die carrier base support component 12. The die carrier hinge bases 16C and 16D are spaced from one another and extend upward from a rear portion of the die carrier base support component 12.

The die carrier substrate 14 has a thickness of approximately 145 microns. In another embodiment, the die carrier substrate 14 may be between 135 and 155 microns thick. The die carrier substrate 14 has four openings, each of which is positioned over a respective one of the die carrier hinge bases 16A-D. As illustrated in FIG. 1A, a central portion of the die carrier substrate 14 rests partially on the die carrier base support component 12 and partially on a compliant rubber membrane 15A that seats in a pocket 15B in a top surface of the die carrier base support component 12. The die carrier substrate 14 has a width W-1 which is more than a width W-2 of the die carrier base support component 12, so that left and right portions 30A and 30B of the die carrier substrate 14 extend beyond the die carrier base support component 12.

The die carrier body 18 also has four openings, each of which is positioned over a respective one of the die carrier hinge bases 16A-D. The die carrier hinge bases 16A-D align the die carrier body 18 with respect to the die carrier substrate 14. The die carrier body 18 has a retaining formation 32 formed therein. Sides of the retaining formation 32 are formed by respective portions of the die carrier body 18, and a base of the formation 32 is formed by the die carrier substrate 14.

The die carrier cover 20 includes a cover hinge component 34 and a cover pressure plate 36. The cover pressure plate 36 is secured to the cover hinge component 34 in a manner that allows for pivoting or rocking of the cover pressure plate 36 relative to a cover hinge component 34, and for the cover pressure plate 36 to be depressed toward the cover hinge component 34. A compression spring (not shown) between the cover hinge component 34 and cover pressure plate 36 biases the cover pressure plate 36 away from the cover hinge component 34.

The cover hinge component 34 has two end components 38 that are positioned over the die carrier hinge bases 16C and 16D. The rear die carrier torsion spring 26B is inserted between the die carrier hinge bases 16C and 16D.

The die carrier latch 22 has two end portions 40 that are positioned over the die carrier hinge bases 16A and 16B. The front die carrier torsion spring 26A is inserted between the die carrier hinge bases 16A and 16B.

The front die carrier hinge pin 24A is inserted through openings in portions of the die carrier body 18, the end portions 40 of the die carrier latch 22, the die carrier hinge bases 16A and 16B, and through the front die carrier torsion spring 26A. The front die carrier hinge pin 24A so secures a front portion of the die carrier body 18 through the die carrier hinge bases 16A and 16B to the die carrier base support component 12 without the need for any additional space-consuming screws or nuts, and simultaneously secures the die carrier latch 22 pivotably to the die carrier body 18.

Similarly, the rear die carrier hinge pin 24B is inserted through openings in portions of the die carrier body 18, the end portions 38 of the cover hinge component 34, the die carrier hinge bases 16C and 16D, and through the rear die carrier torsion spring 26B. The rear die carrier hinge pin 24B so secures a rear portion of the die carrier body 18 through the die carrier hinge bases 16C and 16D to the die carrier base support component 12, and simultaneously secures the cover hinge component 34 pivotably to the die carrier body 18.

In use, a bare microelectronic die (not shown) is inserted into the retaining formation 32 with terminals of the microelectronic die located on the die carrier substrate 14. This orientation of the die is termed "flip chip" in the electronic industry. A vacuum is applied through suction holes 41 in the die carrier substrate 14 and die carrier base support component 12 to hold the die down.

The die carrier cover 20 is then pivoted about the rear die carrier hinge pin 24B and against a spring force created by the rear die carrier torsion spring 26B, so that the cover pressure plate 36 comes into contact with an upper surface of the microelectronic die (back side of die in flip chip orientation). Pivoting of the cover pressure plate 36 relative to the cover hinge component 34 allows for leveling of a surface of the cover pressure plate 36 on the upper surface of the microelectronic die. When pressure is applied to an external surface of the cover hinge component 34, a force is created by the spring between the cover pressure plate 36 and the cover hinge component 34, which biases the microelectronic die against the die carrier substrate 14.

A tip 42 of the cover hinge component 34 moves an engaging formation 44 of the die carrier latch 22 out of the way against a spring force created by the front die carrier spring 26A. The engaging formation 44 subsequently "snaps" over the tip 42 and retains the die carrier cover 20 in a closed position. The microelectronic die is then held within the retaining formation 32.

Figure 2:
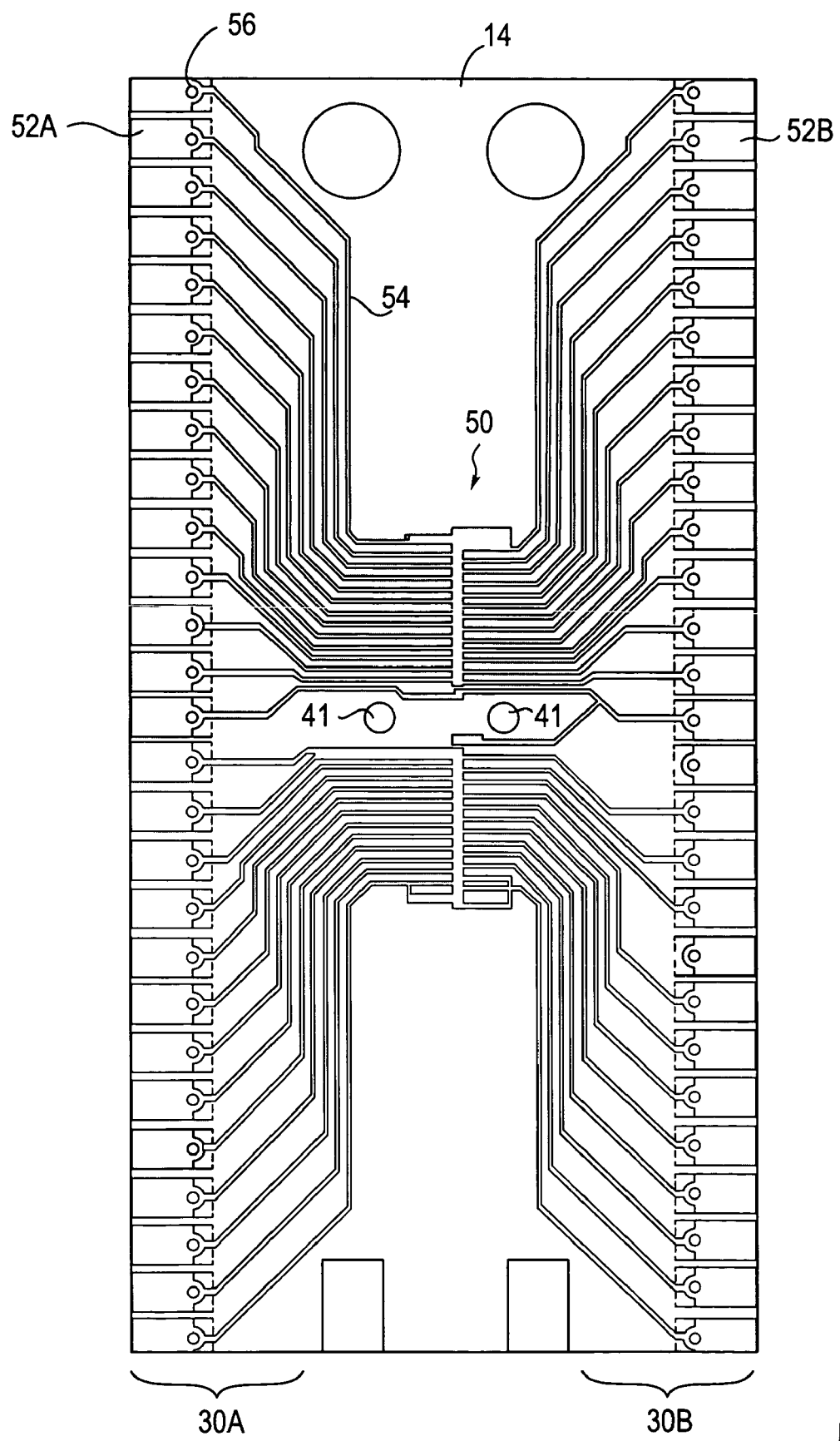
FIG. 2 is top plan view illustrating die contacts, die carrier contacts, and fan-out traces on an upper surface of a die carrier substrate forming part of the die carrier of FIG. 1.

As illustrated in FIG. 2, the nonconductive die carrier substrate 14 has a number of conductive features formed thereon and therein, including a plurality of die contacts 50, a plurality of die carrier contacts 52, and a plurality of fan-out traces 54. The die contacts 50 are located in a central region of the die carrier substrate 14. The die contacts 50 correspond to the layout of the terminals on the microelectronic die, so that each terminal on the microelectronic die makes contact with a respective one of the die contacts 50. The die carrier base component 12 and the pocketed compliant rubber membrane 15A provide opposing support for the die carrier substrate 14. The rubber membrane 15A, due to its compliancy, allows for vertical movement of the die contacts relative to the die carrier base support component 12 and ensures proper contact between each one of the die contacts 50 on the die carrier substrate 14 with each one of the terminals on the die. In another embodiment compliance may be provided by the die carrier substrate 14, the die contacts 50, or the terminals on the die.

The die carrier contacts 52 are located in left and right rows 52A and 52B respectively on edges of the left and right portions 30A and 30B of the die carrier substrate 14. Each one of the die carrier contacts 52A or 52B is connected through a respective fan-out trace 54 to a respective one of the die contacts 50. More die carrier contacts (not shown) are formed on a lower surface of the die carrier substrate 14. The die carrier contacts on the lower surface of the die carrier substrate 14 have a layout that corresponds to the layout of the die carrier contacts 52A and 52B on the upper surface of the die carrier substrate 14. A respective via 56 within the die carrier substrate 14 interconnects a respective one of the die carrier contacts 52A or 52B with a respective one of the die carrier contacts on the lower surface of the die carrier substrate 14. Each die carrier contact on the lower surface of the die carrier substrate 14 is thus also electrically connected through a respective via 56 and fan-out trace 54 to a respective one of the die contacts 50.

In the particular embodiment, there are 27 of the die carrier contacts 52A and 27 of the die carrier contacts 52B. In another embodiment, there may be between 22 and 35 die carrier contacts in a particular row. One other embodiment has 33 die carrier contacts on a particular side. In the particular embodiment, the die carrier substrate 14 has a width of approximately 12 mm and a length of approximately 21 mm. In another embodiment, the width may be between 9 and 13 mm, and the length may be between 18 and 24 mm.

The die carrier 10 is first inserted into a test contactor for purposes of performing a pre-burn-in test on the die. The test contactor is designed to accommodate a typical TSOP electronic assembly, and the die carrier 10, its shape, dimensions, and contact layout are designed to fit into and cooperate with the test contactor, with the die carrier contacts on the lower surface of the die carrier substrate 14 making contact with corresponding contacts of the test contactor. The die carrier 10 with the die is removed from the test contactor upon completion of the pre-burn-in test, and inserted into a typical TSOP burn-in socket for purposes of carrying out a burn-in test.

Figure 4:
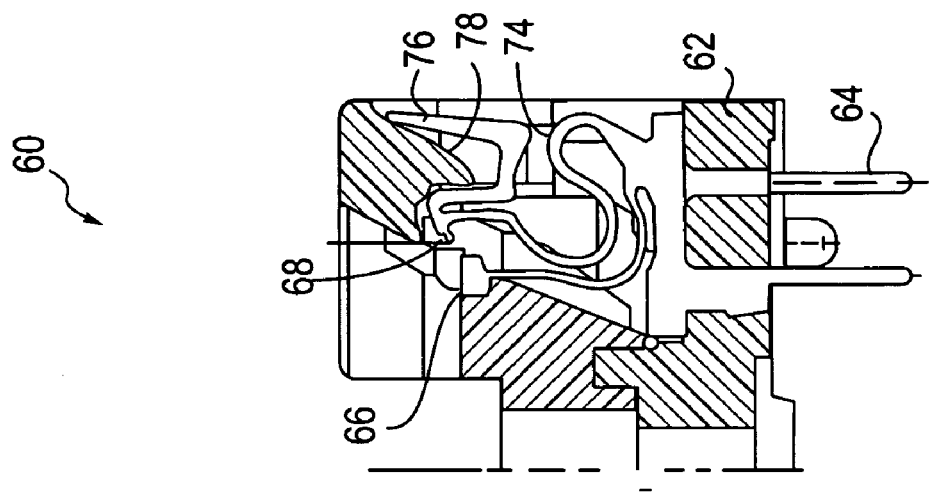
FIG. 4 is a cross-sectional end view of a portion of the socket illustrating movement of upper socket contacts thereof into a retracted position.
Figure 3:
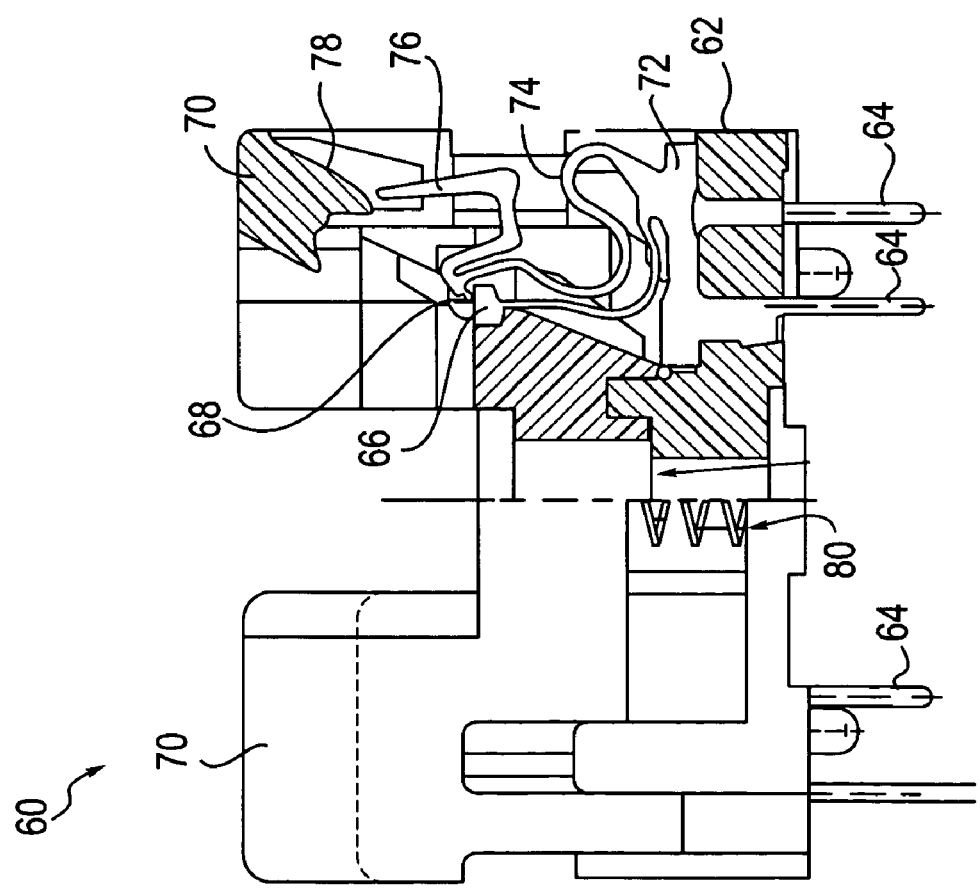
FIG. 3 is a partially cross-sectioned end view of a socket for which the die carrier of FIG. 1 is designed.

FIGS. 3 and 4 illustrate a typical TSOP burn-in socket 60 for which the die carrier 10 of FIG. 1 is designed. The left half of FIG. 3 illustrates external components of the socket 60, and the right half illustrates internal components in cross-section. A cross-section through the left half would mirror of the cross-section of the right half shown in FIG. 3.

The socket 60 includes a socket body 62, circuit board connector pins 64, left and right rows (only the right row shown) of electrically conductive lower socket contacts 66, left and right rows (only the right row shown) of electrically conductive upper socket contacts 68, and a socket actuator component 70.

The circuit board connector pins 64 are secured and extend from a lower surface of the socket body 62. The circuit board connector pins 64 are inserted into corresponding holes in a circuit board of a burn-in board (not shown). More sockets are connected in a similar manner to the circuit board. Electric current can be provided from the circuit board through the circuit board connector pins 64 to the lower socket contacts 66 and the upper socket contacts 68. A plurality of sockets such as the sockets 60 are usually connected to one circuit board and form a permanent or semi-permanent assembly.

A plurality of common junctions 72 are secured within the socket body 62 and are electrically insulated from one another. Each circuit board connector pin 64 is electrically connected to a respective one of the common junctions 72.

Each lower socket contact 66 is electrically connected to a respective common junction 72, and is at the location wherein an upper surface of the respective lower socket contact 66 is exposed. Each upper socket contact is connected through a respective clamping spring 74 to a respective common junction 72. Each upper socket contact 68 is movable between a contacting position as shown in FIG. 3 and a retracted position as shown in FIG. 4. In the contacting position, the respective upper socket contact 68 can move into contact with the upper surface a respective lower socket contact 66. The respective lower and upper socket contacts 66 and 68 referred to are both connected to a respective common junction 72, and are thus at the same voltage as the respective common junction 72. In the retracted position, as shown in FIG. 4, the clamping spring 74 is bent so that the respective upper socket contact 68 moves upward and to the right of the respective lower socket contact 66.

The socket actuator component 70 is secured to the socket body 62 for movement between a raised position illustrated in FIG. 3 and a lowered position illustrated in FIG. 4. A respective link component 76 is secured to each respective upper socket contact 68 and slides along a surface 78 of the socket actuator component 70, such that a tip of the link component 76 moves to the right when the socket actuator component 70 is lowered. Movement of the link component 76 to the right permits the upper socket contact 68 to move upward and to the right of the lower socket contact 66.

All the upper socket contacts 68 in a particular row move in unison upward and to the right. The upper socket contacts in the left half of the socket 60 simultaneously move in unison upward and to the left. A spacing between the left and right rows of upper socket contacts 68 thus increases when the socket actuator component 70 is lowered. This spacing again decreases when the socket actuator component is raised under the restoring force of a socket spring 80 between the socket body 62 and the socket actuator component 70.

In use, the upper socket contacts 68 are moved into the retracted position shown in FIG. 4. The die carrier 10 of FIG. 1 with the microelectronic die held therein is then inserted into the socket 60. The left and right rows of die carrier contacts 52 on the lower surface of the die carrier substrate 14 are positioned on top of the left and right rows of lower socket contacts 66. The upper socket contacts 68 are then moved into the position shown in FIG. 3, with the die carrier substrate 14 clamped between the upper and lower socket contacts 68 and 66. Each one of the upper socket contacts 68 on the right in FIG. 3 makes contact with a respective one of the die carrier contacts 52B in the row on the right in FIG. 2. Similarly, each one of the upper socket contacts in the left of the socket 60 of FIG. 3 makes contact with a respective one of the die carrier contacts 52A in the row on the left in FIG. 2. The pitch between the die carrier contacts 52B in the row on the right thus corresponds to the pitch between the upper socket contacts 68. Furthermore, the spacing between the left and right rows of die carrier contacts 52A and 52B is designed to correspond to the spacing between the left and right rows of upper socket contacts 68. Current can now conduct through respective circuit board connector pins 64, common junction 72, a respective pair of upper and lower socket contacts 68 and 66, a respective pair of die carrier contacts 52 on upper and lower surfaces (only 52 on the upper surface shown) of the die carrier substrate 14, a respective fan-out trace 54, and a respective die contact 50, to or from a respective terminal on the microelectronic die.

What should generally be noted is that the die carrier 10 of FIG. 1 is specifically designed to be used within the socket 60. More specifically, the die carrier 10 has a substrate 14 with die carrier contacts 52 thereon that are dimensioned specifically to match the positioning of the upper and lower socket contacts 68 and 66. The die carrier substrate 14, being 145 microns thick, can also fit between the upper and lower socket contacts 68 and 66. The die carrier base support component 12, being located below only a portion of the die carrier substrate 14, does not impair insertion of the die carrier substrate 14 into the relatively small spacing between the upper and lower socket contacts 68 and 66. Damage to the die carrier substrate 14 is avoided by clamping edges of the die carrier substrate 14 from opposing sides between the upper and lower socket contacts 68 and 66. What should also be noted is that there are no screws or nuts within the die carrier base support component 12 that may increase its size and prevent it from being inserted into the socket 60. What should further be noted is that a double-sided, robust electrical connection is made by each respective pair of upper and lower socket contacts 68 and 66.

The die carrier 10, in combination with the socket 60, provides a microelectronic die connection assembly that allows for signals to be transmitted between the circuit board and the microelectronic die for purposes of testing the microelectronic die. Once burn-in testing is completed, the die carrier 10 is removed from the socket.

Figure 5:
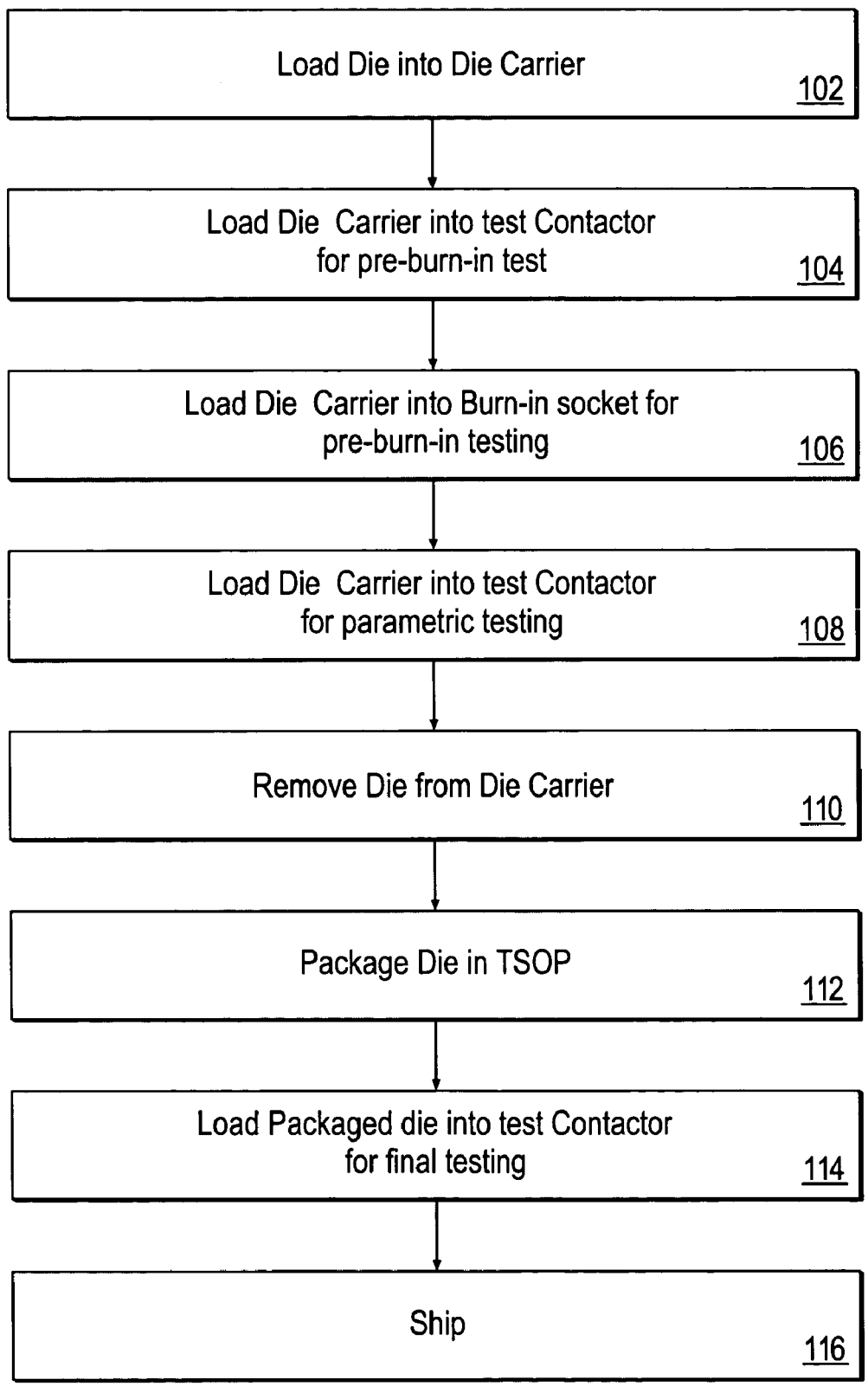
FIG. 5 is a block diagram illustrating testing of microelectronic dies according to one embodiment of the invention.

FIG. 5 illustrates the entire process for testing and packaging the die. The die is first loaded into the die carrier 10, as hereinbefore described with reference to FIG. 1 (Step 102). The die carrier 10 is then loaded into the test contactor for purposes of carrying out the pre-burn-in test (Step 104). The die carrier 10 is then removed from the test contactor and inserted into the burn-in socket 60 as hereinbefore described with reference to FIG. 3, for purposes of carrying out the burn-in testing (Step 106). More die carriers, each holding a respective die, are inserted into similar sockets on a burn-in board, and the burn-in board is then inserted into a burn-in oven where the burn-in testing is carried out. Following pre-burn-in testing, the burn-in board is removed from the burn-in oven, and the die carrier 10 is removed from the burn-in socket 60 and again inserted into the test contactor for purposes of carrying out parametric testing on the die (Step 108). The die carrier 10 is then removed from the test contactor and the die is then removed from the die carrier following the reverse of the process described with reference to FIG. 1 (Step 110). The die is then packaged in a conventional TSOP (Step 112), or is available to ship to a customer as a fully tested and burned-in bare die. The packaged die is then again loaded into the test contactor (Step 114). The layout of the contacts on the TSOP are the same as the layout of the contacts on the die carrier 10, so that the same test contactor can be used for purposes of testing the packaged die in Step 114 as for testing the die at Steps 104 and 108. Once final testing of the packaged die is completed, the packaged die is removed from the test contactor. The packaged die can then be shipped to a customer (Step 116).

Figure 6:
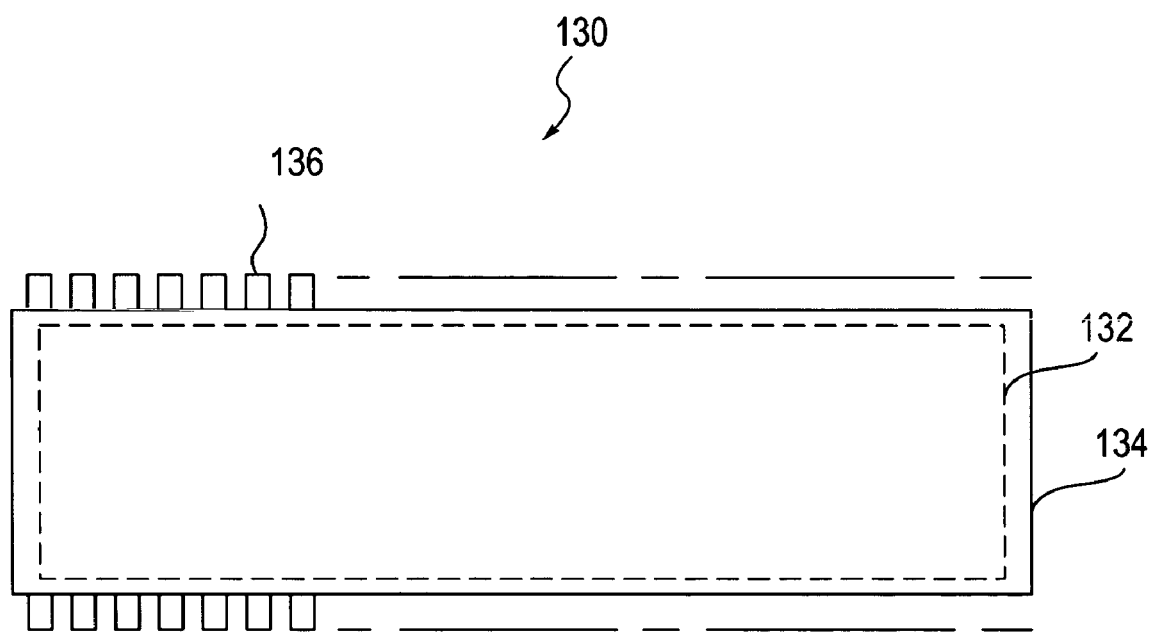
FIG. 6 is a top plan view of a typical TSOP electronic device that can be tested using the same equipment as in FIG. 3.

FIG. 6 illustrates a TSOP electronic device 130 of the kind tested in Step 114. The TSOP electronic device 130 includes a microelectronic die 132, permanently encapsulated with a material 134, and a plurality of leads 136 extending from the material 136. The positioning of the leads 136 is the same as the die carrier contacts 52 in FIG. 2, which allows for the device 130 to be tested in the test contactor at Step 114. The same test contactor and the same socket 60 may be used to test other TSOP electronic devices that are identical to the device 130.

The purpose of a die carrier of the aforementioned kind is normally to provide a temporary structure for holding a die and handling the die so that the die can be inserted and be removed from a socket while being held within the die carrier. The die carrier 10 of FIG. 1 can alternatively be used as an adapter that is held within a socket, and a die can be placed into and removed from the die carrier 10 while the die carrier is held within the socket.

Figure 7:
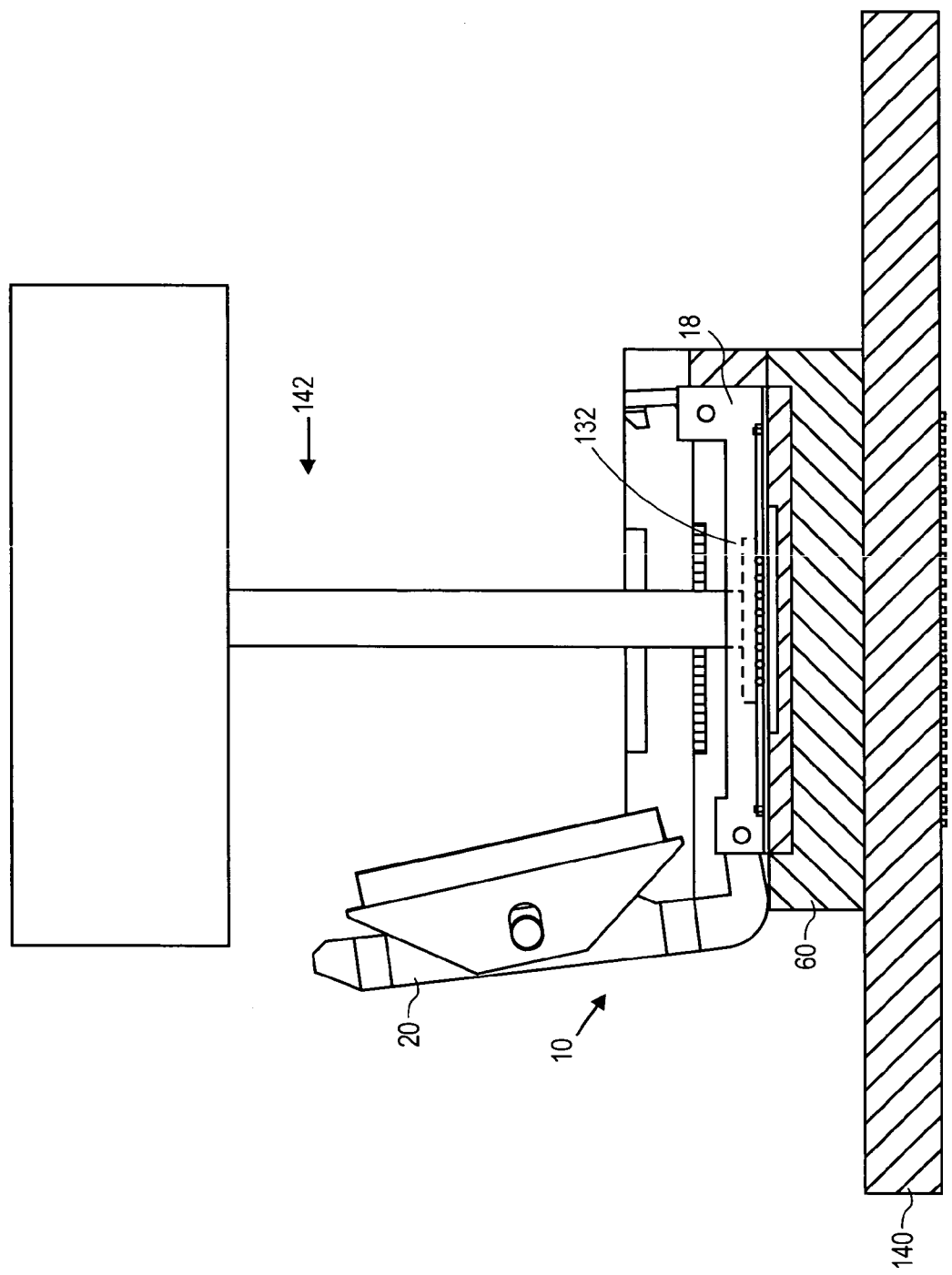
FIG. 7 is a partially cross-sectioned side view of a burn-in board, with one socket mounted thereto, a die carrier held by the socket, and a tool which is used to place a microelectronic die in the die carrier.

FIG. 7, for example, illustrates a burn-in board 140 extending in a horizontal plane, one TSOP burn-in socket 60 permanently mounted to an upper side of the burn-in board 140, one die carrier 10 releasably held by the socket 60, a handling tool 142, and one die 132 held by the tool 142. The die carrier cover 20 is moved into an open position relative to the die carrier body 18. The tool 142 is used in a vertically downward direction and to place the die 132 in the die carrier body 18 while the die carrier 10 is held by the socket 60. The dimensions of the socket 60 and the die carrier cover 20 by design allow for the die carrier cover 20 to open sufficiently and allow the tool 142 and the die 132 to access a location in the die carrier body 18 where the die is placed. The die 132 is then released from the tool 142. The die carrier cover 20 is then closed over the die 132. The die 132 can be removed by opening the die carrier cover 20, engaging the tool 142 with the die 132, and using the tool 142 to remove the die 132 from the die carrier body 18. The tool 142 can then be used to place another die in the die carrier body 18. Without removing the die carrier 10 from the socket 60, the die 132 is placed and held within the die carrier 10, tested, then removed and replaced with another die. There is thus no need for additional tooling to remove the die carrier 10 from the socket 60 every time a die has to be placed within the die carrier 10.

Figure 8A:
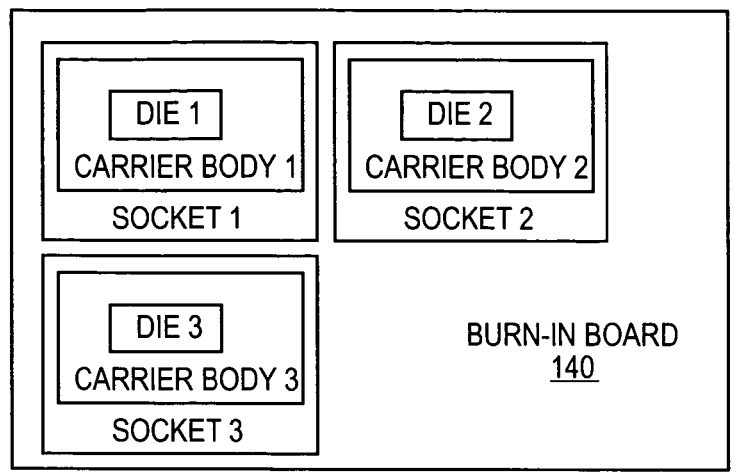
FIGS. 8A to 8E are plan views of a burn-in board illustrating how successive sets of dies are placed on the burn-in board without removing a die carrier from sockets on the burn-in board, according to another embodiment of the invention.

FIGS. 8A to 8E illustrate how successive sets of dies can be loaded on the burn-in board 140 and be tested. As illustrated in FIG. 8A, a plurality of sockets, represented by sockets 1, 2, and 3, are permanently mounted in rows and columns to the burn-in board 140. A respective die carrier is inserted and releasably held by a respective socket 1, 2, and 3. The die carriers are represented by the die carrier bodies 1, 2, and 3. A first set of dies, represented by the dies 1, 2, and 3, are inserted into the die carrier bodies 1, 2, and 3, each die carrier body 1, 2, and 3 holding a respective die 1, 2, and 3.

Figure 8B:
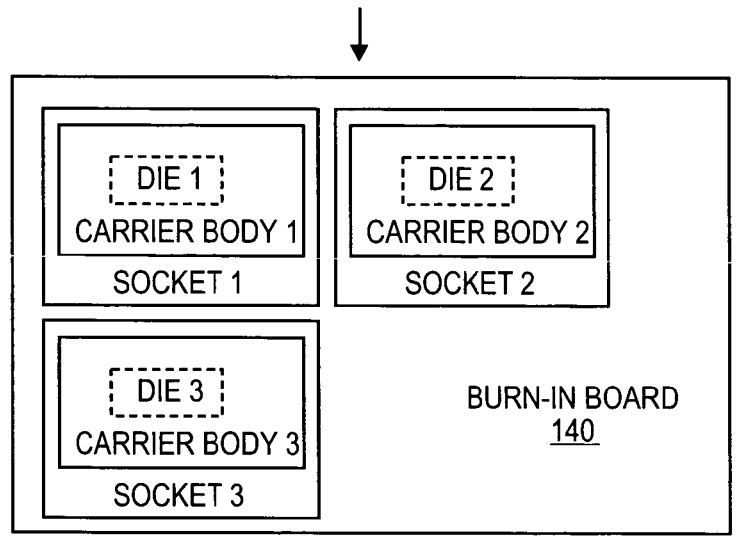

As illustrated in FIG. 8B, a respective die carrier cover, represented by die carrier covers 1, 2, and 3 is then closed over a respective die 1, 2, and 3. The dies 1, 2, and 3 are then releasably held within the respective die carriers, represented by the die carrier covers 1, 2, and 3, and the die carriers in turn are releasably held by the respective sockets 1, 2, and 3. The burn-in board 140 with the dies 1, 2, and 3 is then inserted into a burn-in, tester where they are tested. Following testing of the dies 1, 2, and 3, the burn-in board 140 is removed from the burn-in tester.

Figure 8C:
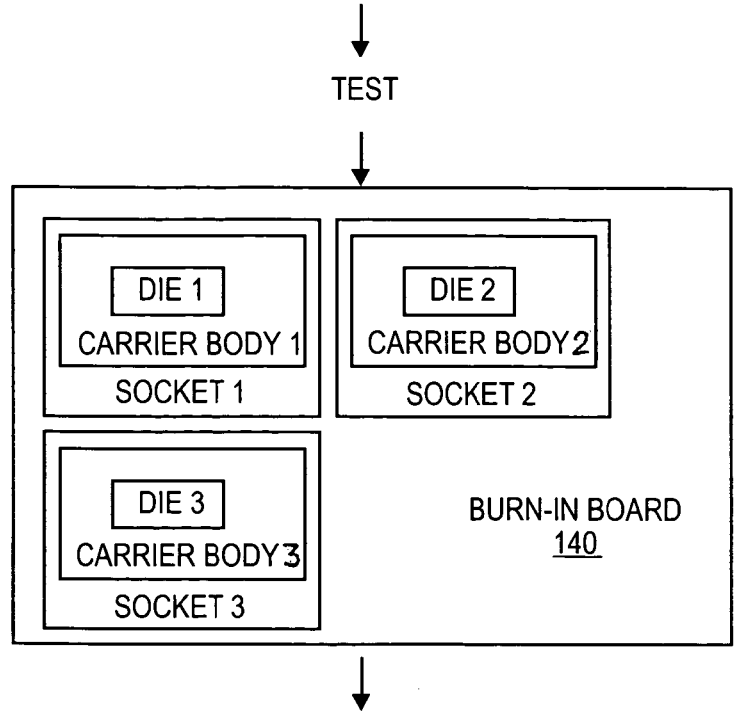
Figure 8D:
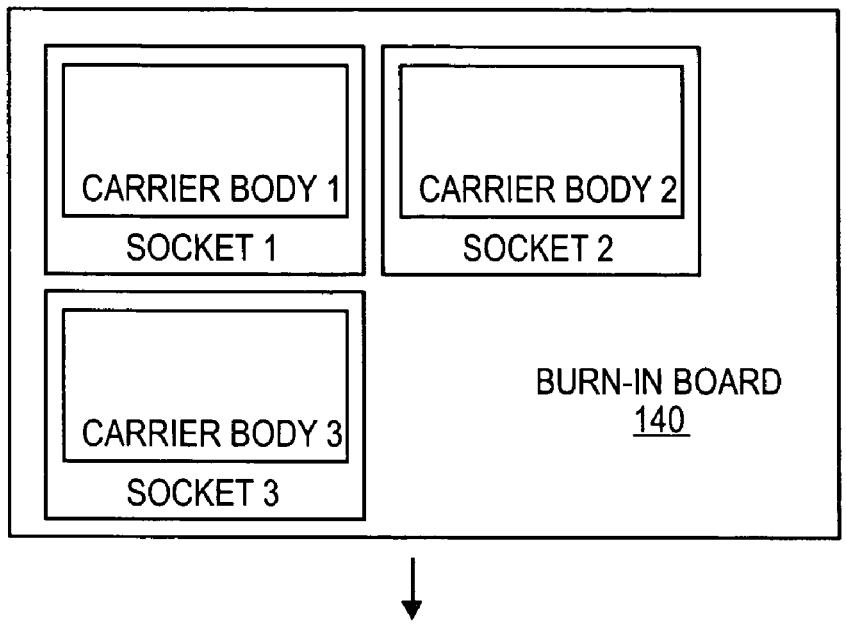

As illustrated in FIG. 8C, the die carrier covers 1, 2, and 3 are again opened to provide access to the dies 1, 2, and 3. Referring to FIG. 8D, the dies 1, 2, and 3 are removed from the die carrier bodies 1, 2, and 3. The die carrier bodies 1, 2, and 3, however, remain within the sockets 1, 2, and 3.

Figure 8E:
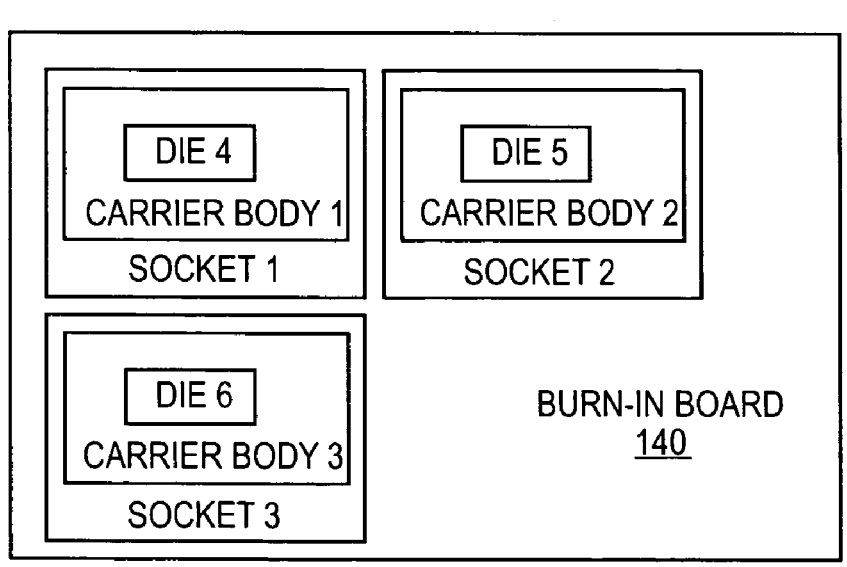

As illustrated in FIG. 8E, a second set of dies, represented by dies 4, 5, and 6, are then inserted into the die carrier bodies 1, 2, and 3, respectively. The process illustrated in FIGS. 8A to 8D can then be repeated with the second set of dies 4, 5, and 6, and subsequent sets of dies can be tested in a similar manner.

It can thus be seen that subsequent sets of dies can be tested with the die carriers serving as adapters between the dies and the sockets 1, 2, and 3, and without the need for removing the die carriers from the sockets 1, 2, and 3. The die carriers are, however, still removable from the sockets 1, 2, and 3 to allow for different die carriers or packaged devices to be inserted in the permanently mounted sockets 1, 2, and 3.

Although an embodiment of the present invention has been described by way of example with reference to the testing of bare dies, it is also possible that other devices may be tested. Other die-specific packages that can be tested are for example sometimes referred to as Chip Scale Packages and Wafer Level Chip Scale Packages, the latter being a more recent term for flip-chip die that emphasizes that the die was turned into a package while still in the wafer form.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of testing microelectronic dies, comprising:
   inserting a first set of dies into a set of die carriers releasably held within a set of sockets secured to a test board;
   testing the first set of dies while being held in the die carriers;
   removing the first set of dies from the die carriers without removing the die carriers from the sockets;
   inserting a second set of dies into the die carriers releasably held within the socket secured to the test board;
   testing the second set of dies while being held in the die carriers; and
   removing the second set of dies from the die carriers without removing the die carriers from the sockets.

2. The method of claim 1, wherein the dies are bare dies.

3. The method of claim 1, wherein each die is inserted into a die carrier body of the respective die carrier, further comprising:
   closing a respective die carrier cover over each respective die after inserting the respective die into the respective die carrier body; and
   opening the die carrier covers after testing the respective dies, the die carrier covers opening sufficiently to allow for removal of the dies from the die carriers.

4. The method of claim 1, wherein the test board is a burn-in board, further comprising:
   inserting the burn-in board with the first set of dies into a burn-in oven to test the dies; and
   removing the burn-in board with the dies from the burn-in oven after the dies are tested.

5. The method of claim 1, further comprising:
   removing the set of die carriers from the set of sockets.

6. A method of testing microelectronic dies, comprising:
   inserting a first set of die carriers into a set of sockets secured to the test board;
   inserting a set of dies into the first set of die carriers;
   testing the first set of dies while being held in the first set of die carriers;
   removing the first set of dies from the first set of die carriers without removing the first set of die carriers from the sockets; and
   removing the first set of die carriers from the set of sockets.

7. The method of claim 6, further comprising:
   inserting a second set of die carriers into the set of sockets.

* * * * *